United States Patent [19]

Lelandais

[11] 4,389,683
[45] Jun. 21, 1983

[54] SWITCH-TUNED FILTERS

[75] Inventor: Guy Lelandais, Bure sur Yvette, France

[73] Assignee: Enertec, Montrouge, France

[21] Appl. No.: 198,564

[22] Filed: Oct. 20, 1980

[30] Foreign Application Priority Data

Oct. 31, 1979 [FR] France ................. 79 26969

[51] Int. Cl.³ .......................... G11B 5/45; G11B 5/02
[52] U.S. Cl. ......................................... 360/65; 360/67
[58] Field of Search .................................. 360/65, 67

[56] References Cited

U.S. PATENT DOCUMENTS 3,465,321  9/1969  Reisfeld ................. 360/67
4,091,380  5/1978  Yu ........................ 360/67

Primary Examiner—Vincent P. Canney
Attorney, Agent, or Firm—Dale Gaudier

[57] ABSTRACT

A switch-tuned filter comprises a capacitive filter and a resonant filter both receiving an input signal to be filtered. The resonant filter comprises a gyrator the frequency response of which depends on circuit parameters in two circuit paths therein. A tuning switch is arranged to select the values of the parameters in each of these circuit paths. The output signals of the gyrator and the capacitive filter are combined to form the filtered output signal. The circuit can be used as an equalizer in a magnetic tape recorder.

11 Claims, 2 Drawing Figures

SWITCH-TUNED FILTERS

TECHNICAL FIELD

This invention relates to switch-tuned filters, and particularly, though not exclusively, to switch-tuned filters for use in equalisers in magnetic tape recorders.

BACKGROUND ART

During replay of a previously-recorded electrical signal, tape recorders rely on the principle of magnetic induction to re-create the electrical signal from a pattern of magnetisation established on a magnetic tape during the record process. However, the magnitude of a magnetically-induced voltage signal is proportional to the rate of change of magnetic field, so the amplitude of the electrical signal generated by the relay head is a function not only of the amplitude of the original electrical signal but also both of the frequency of that signal and of the speed at which the tape passes the replay head. In order to derive an accurate reproduction of the original electrical signal, the replay head signal is supplied to a filter (known as an equaliser) which compensates for the distortion introduced by the frequency and speed depedence of the replay process.

Since the replay head signal is dependent, in part, on the tape speed, it is common practice to provide an individual filter circuit for each possible tape speed, the response of each respective filter being selected to match the frequency response of the replay head at the respective tape speed. Obviously in a multi-track tape recorder it is necessary to provide a separate set of filters covering the full range of tape speeds for each track: thus an 8-track, 8-speed recorder would require 64 individual filters. Furthermore, the precise frequency response differs, owing to manufacturing tolerances affecting the replay heads, as between one track and another. Consequently, each individual filter may have to include up to 4 individual adjustments to enable it to be accurately matched with its associated replay head, with the result that some 256 separate such adjustments would be required for the overall equaliser. This in turn leads to considerable expense, both in terms of the cost of providing adjustable components, and in terms of the time and cost of performing such a large number of adjustments.

It is an object of this invention to reduce the number and cost of these adjustments.

DISCLOSURE OF INVENTION

According to one aspect of this invention a switch-tuned filter for use in an equaliser in a magnetic tape recorder is characterised by:
input means arranged to receive an input signal;
a capacitive filter responsively coupled to said input means to provide a first filtered signal;
a resonant filter responsively coupled to said input means to provide a second filtered signal, said resonant filter including a gyrator and having a frequency response dependent at least in part on circuit values in two circuit paths in said gyrator;
switch means arranged to select different circuit values in at least one of said paths; and
means responsively coupled to said capacitive filter and said resonant filter to combine said first and second filtered signals.

The term 'gyrator' is used herein to mean an inductor-less circuit having impedance characteristics analogous to those of an inductor.

With such an arrangement, it is possible to reduce the number of filters in a tape recorder equaliser to one per track, each filter having only two adjustments.

Furthermore, if the capacitive filter has a purely capacitive frequency response, the same capacitor can be used in this filter for all tape speeds.

Preferably the switch means is arranged to select different circuit values in each of said paths.

The switch means may be arranged to select different resistive values in one of said circuit paths and different capacitive values in the other path, and in particular may be arranged to select values which successively double. The said other path may include variable resistive means in series with said selectable capacitive values, this variable resistance providing the first adjustment, in the case of a tape recorder, to allow for variations in frequency response between different replay heads.

The resonant filter may be coupled to said combining means via variable-gain amplifier means, which in a tape recorder constitutes the second adjustment, to match the overall equaliser frequency response to that of the replay head.

The resonant filter may comprise fixed-value capacitance means in parallel with said gyrator.

The combining means may be arranged to sum said first and second filtered signals.

The input means may be arranged to provide anti-phase signals to said capacitive filter and said resonant filter respectively.

The switch-tuned filter may include amplitude-control means responsively coupled to said input means to provide a controlled-amplitude signal, the combining means being responsively coupled to the amplitude-control means to combine the controlled-amplitude signal with the filtered signals. In this case, the amplitude-control means may be coupled to the combining means via means for selectively inverting the controlled-amplitude signal, in order to provide, in the case of a tape recorder, compensation for playback of a tape in the reverse direction to that in which it was recorded.

According to another aspect of this invention there is provided a tape recorder characterised by:
an equaliser comprising a switch-tuned filter as defined above.

BRIEF DESCRIPTION OF DRAWINGS

A switch-tuned filter in accordance with this invention in an equaliser forming part of a magnetic tape recorder will now be described, by way of example, with reference to the accompanying drawings, in which.

BEST MODE FOR CARRYING OUT THE INVENTION/INDUSTRIAL APPLICABILITY

Figure 1:
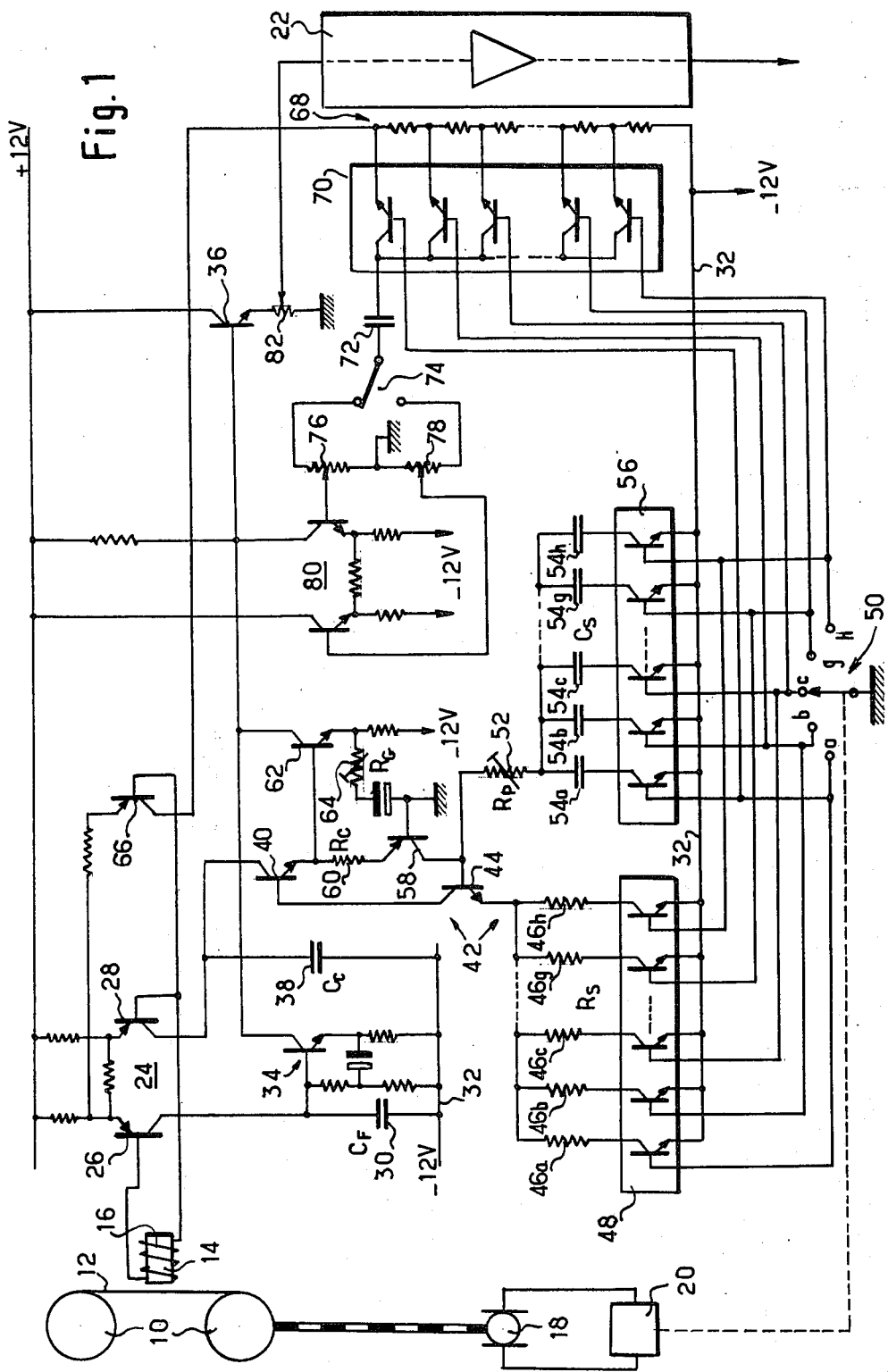
FIG. 1 is a schematic diagram of part of a magnetic tape recorder, showing the circuit of the equaliser.

Referring to FIG. 1, there is shown in diagrammatic form a magnetic tape recorder including two spools 10 carrying magnetic tape 12 which extends between the spools 10 past a replay head 14. (For convenience and clarity, the record and erase heads and their associated circuitry, which also form part of a tape recorder, have been omitted from FIG. 1.) The replay head 14 has several coils, one for each track recorded on the tape 14, stacked along an axis parallel to the width of the tape 14 and therefore transverse to the plane of the paper in FIG. 1-again for clarity, only one such coil, 16, is shown.

An electric motor 18 (for example, a stepping motor) is mechanically coupled to drive the spools 10 in response to a pulse waveform signal generated by a control unit 20. The pulse repetition frequency of this signal can be manually selected to vary the speed of the motor 18 and thus the speed at which the tape 12 passes the replay head 14.

As noted earlier, the frequency response of a replay head is not constant, but varies as a function of the frequency of reversal (and thus rate of change) of magnetic field permeating the replay head. This frequency is in turn dependent both on frequency of the recorded signal and on the speed at which the tape 12 passes the replay head 14.

Figure 2:
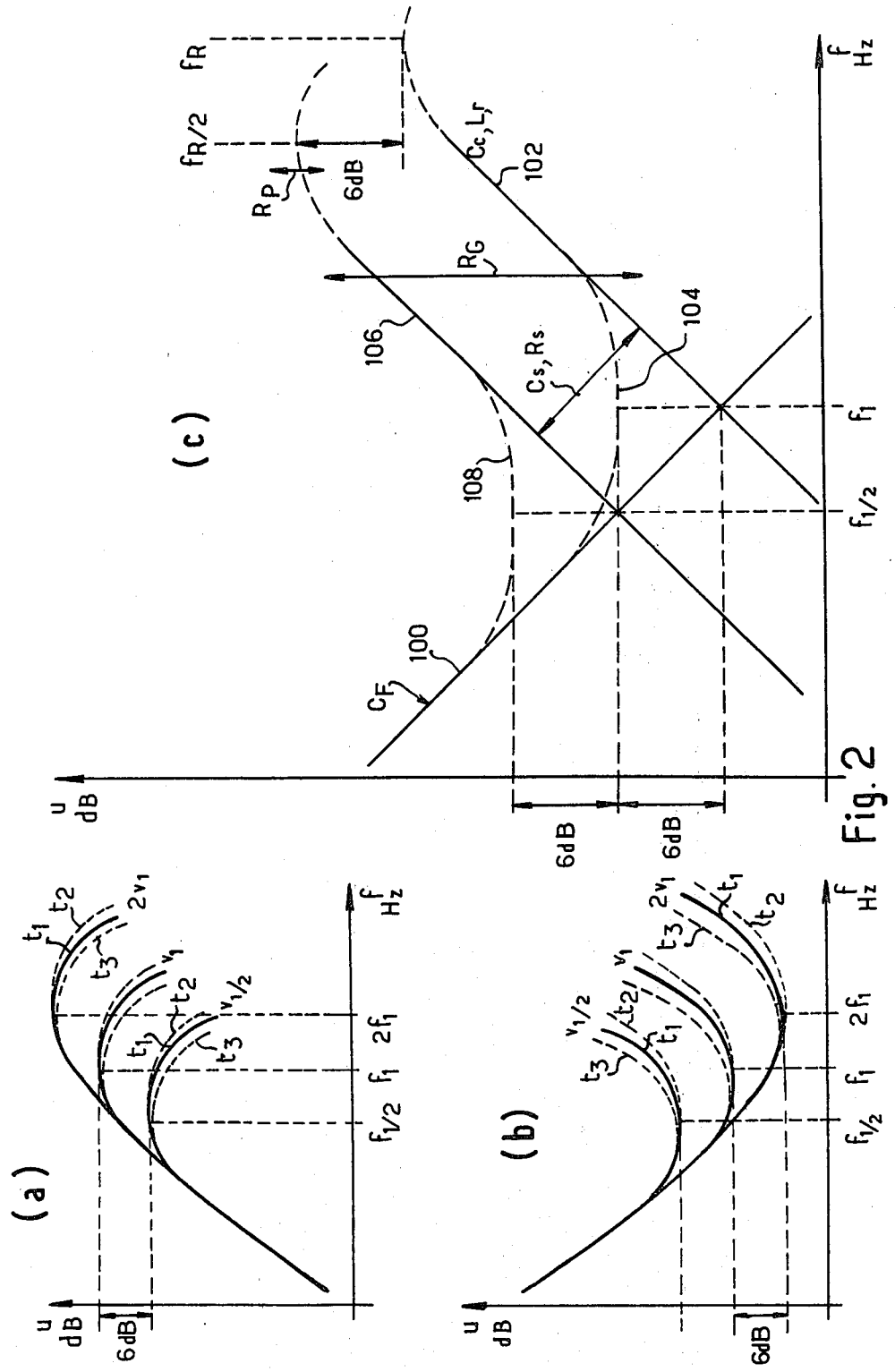
FIG. 2 shows frequency response curves of a replay head and the equaliser.

FIG. 2(a) indicates the general form of the frequency response of the replay head 14, for a recorded signal of constant amplitude, as a function of the signal frequency f and the tape speed v. It can be seen that for a given speed $v_1$, the amplitude u of the replay head signal rises with frequency up to a maximum at a frequency $f_1$, after which the amplitude falls again. At twice the speed (that is, at $2v_1$), the same recorded signal produces a response of the same form but with a peak at a frequency 2f, and 6 dB higher in amplitude. Likewise at a speed $v_1/2$, the peak is at $f_1/2$ and has an amplitude 6 dB less than that at speed $v_1$. The solid curves in FIG. 2(a) show the frequency responses of an 'average' coil associated with track $t_1$ on the tape 12. Variations caused by manufacturing tolerances may result in the frequency response for another track $t_2$ being slightly but consistently higher at high frequencies, and that for a third track $t_3$ being slightly but consistently lower.

In order to compensate for the non-linear frequency response of the replay head 14, it is conventional to include an equaliser between the head 14 and the remainder of the tape recorder circuitry (shown generally at 22 in FIG. 1). Known equalisers typically have, for each track, a separate set of filters, each filter providing one of the frequency responses shown in FIG. 2(b) and corresponding to a respective one of the tape speeds, such as $v_1$, $2v_1$ or $v_1/2$. This each individual filter must include adjustments both to allow for tolerances in the components (in particular, coils) of which it is made, but more especially to allow the filters in any one set to be matched to the particular frequency response, such as $t_1$, $t_2$ or $t_3$, for the track with which that set is associated. As a result conventional equalisers typically involve a hundred or more individual adjustments, and are therefore very expensive to build and adjust for correct operation.

FIG. 1 shows the circuit diagram of one channel of an equliser which significantly alleviates this problem. It is to be understood that this circuit would be duplicated for each track recorded on the tape 12.

Referring to FIG. 1, the coil 16 of the replay head 14 is coupled to a differential amplifier 24 including two transistors 26 and 28. The collector of the transistor 26 is coupled to a first terminal of a capacitor 30 having a value of $C_F$ microfarads, the other terminal of the capacitor 30 being connected to a $-12$ volt rail 32. The first terminal of this capacitor 30 is also coupled via a buffer amplifier 34 to the base of an output transistor 36.

The collector of the transistor 28 is coupled both to a first terminal of a capacitor 38 and also to the base of a transistor 40 which constitutes the input of a gyrator 42. The other terminal of the capacitor 38, which has a value of $C_c$ microfarads, is connected to the $-12$ volt rail 32.

Within the gyrator 42, the base of the transistor 40 is further coupled to the collector of a transistor 44, the emitter of which is connected to a group of close-tolerance resistors 46a to 46h. The value ($R_s$ ohms) of each of the resistors 46b to 46h is one half the value of each of the preceding resistors 46a to 46g. The resistors 46a to 46h are coupled to the negative rail 32 via respective electronic switches (for example, MOS transistors) in an array 48, the control terminals of these switches being connected to respective terminals a to h of a multi-way switch 50.

The base of the transistor 44 is coupled via a preset rheostat 52 (value $R_p$ ohms) to a group of close-tolerance capacitors 54a to 54h, the value ($C_s$ microfarads) of each capacitor 54b to 54h being one half the value of its predecessor 54a to 54g in the group. The capacitors 54a to 54h are coupled to the negative rail 32 via respective electronic switches in an array 56, the control terminals of these switches being connected to the terminals a to h of the switch 50.

The base of the transistor 44 is also coupled via the collector-emitter path of a transistor 58 (the base of which is grounded) and a resistor 60 (value $R_c$ ohms) to the emitter of the transistor 40, the collector of which is connected to a $+12$ volt rail 33. This emitter constitutes the output of the gyrator 42 and is coupled via the base-collector junction of a buffer transistor 62 to the base of the output transistor 36. The emitter of the buffer transistor 62 is coupled to the $-12$ volt rail 32 via a resistor, and to ground via a preset rheostat 64 (value $R_G$ ohms) and a capacitor. The setting of the rheostat 64 controls the gain of the buffer amplifier constituted by the transistor 62.

The transistor 28 of the differential amplifier has connected in parallel with it a transistor 66, the collector of which is coupled to one end of a resistor ladder 68. The other end of the resistor ladder 68 is coupled to the $-12$ volt rail 32, and the intermediate junctions along the ladder 68 are coupled by respective electronic switches in an array 70 to a common coupling capacitor 72. The control terminals of the switches in the array 70 are connected to respective terminals a to h of the switch 50, such that the switch for the junction in the ladder 68 nearest the rail 32 is controlled by the terminal h.

A changeover switch 74 connects the capacitor 72 to one or other of two potentiometers 76 and 78, which have coupled terminals connected to ground. The sliders of these potentiometers 76 and 78 are connected to inverting and non-inverting inputs respectively of a differential amplifier 80, the output of which is connected to the base of the output transistor 36.

This output transistor 36 is connected in emitter-follower configuration, with a potentiometer 82 between its emitter and ground, the slider of the potentiometer 82 being coupled to the remainder of the circuitry 22 of the tape recorder.

The wiper of the switch 50 is coupled to the control unit 20 to select a respective one of the terminals a to h in accordance with the selected tape speed; in particular, as the tape speed is doubled, the next terminal (in the sense a towards h) is selected. The wiper itself is electrically grounded, so that it closes the electronic switches, one in each of the arrays 48, 56 and 70, to which it is connected via the selected terminal. Thus only one of the resistors 46a to 46h and of the capacitors 54a to 54h is actually connected to the rail 32, and likewise only one junction in the resistor ladder 68 is connected to the capacitor 72, at any one time and in accordance with the selected tape speed.

In operation, the differential amplifier 24 responds to the signal from the coil 16 in the replay head 14 to supply corresponding but anti-phase constant-current signals respectively to the capacitor 30 and to the combination of the capacitor 38 and the gyrator 42.

The capacitor 30 provides a frequency response in the form of a straight line (on a log-log graph) with a slope of $-6$ dB per octave, as shown in FIG. 2(c) at 100.

In the gyrator 42, the input signal received at the base of the transistor 40 is supplied without change in phase by this transistor 40, operating in emitter-follower mode, to the transistor 58 which is connected in common-base configuration (high gain, zero phase change). At low input signal frequencies (for which the effect of the selected one of the capacitors 54 is relatively insignificant), the amplified signal from the transistor 58 is fed back with net phase inversion via the common-emitter transistor 44 to the base of the transistor 40. Consequently the base of the transistor 40 appears to have a very low impedance. However, as the input signal frequency rises, the selected capacitor 54 falls in impedance, thus reducing the impedance at the collector of the transistor 58 and diminishing the level of negative feedback via the transistor 44, so the apparent impedance at the base of the transistor 40 also rises. Such a rise in impedance with frequency is characteristic of an inductor. Consequently, the gyrator 42 provides, in conjunction with the capacitor 38, a resonant frequency response similar to that of the parallel combination of a capacitor of value $C_c$, an inductor L and a resistor r, where:

$$L \approx R_c \times R_s \times C_s \quad (1)$$

$$\text{and} \quad r \approx R_c \times R_s / R_p \quad (2)$$

It may be shown that the impedance z (which for a constant-current input is proportional to the voltage-drop) of this parallel combination at an angular frequency w ($=2\pi \times$ frequency f) is $$z = r\, w\, L / (wL - jr(1 - w^2 L\, C_c)) \quad (3)$$

The resonant frequency $f_R$ is given by $$w_R^2 = 1/LC_c, \quad (4)$$

at which frequency formula (3) reduces to $$z = r \quad (5)$$

The frequency response of the gyrator 42 is shown in FIG. 2(c) at 102: the portion represented in continuous line rises with a slope of $+6$ dB per octave; the portion in dotted line is the resonant peak, which is arranged to be outside the useful frequency range to be covered by the equaliser.

The function of the output transistor 36 is to sum the frequency responses of the capacitor 30 and the combination of the capacitor 38 with the gyrator 42 (it should be noted in this respect that, in this case, the inherent anti-phase nature of these responses is compensated by the supply of anti-phase signals from the differential amplifier 24). For frequencies much more than an octave either side of the frequency at which the responses are equal (for example, f, in FIG. 2(c)), the total response is substantially equal to the greater of the two responses alone. However, close to f, the responses significantly reinforce one another to produce a linear response (shown in dashed line at 104) in the vicinity of the frequency $f_1$. The overall aggregate response (100 joined to 102 by 104) is closely similar to the desired equaliser characteristic shown in FIG. 2(b).

Furthermore, when the tape speed is decreased by a factor of two for example (thereby shifting the wiper of the switch 50 in a direction towards the terminal a), the values $R_s$ and $C_s$ are doubled. Inspection of formulae (1) and (2) shows that L is thus quadrupled in value and r is doubled. Formula (4) indicates a consequent halving of $w_R$ (and therefore of $f_R$). Substitution of these changes into formula (3) shows that the impedance z of the gyrator 42-capacitor 38 combination doubles for a two-fold reduction in frequency throughout the frequency range. The effect in relation to FIG. 2(c) is to shift the entire resonant response upwards by 6 dB and to the left (down in frequency) by one octave (as is conveniently indicated by the resonant frequency $f_R$), to the position indicated by 106. The aggregate response supplied by the output transistor 36 thus becomes 100 joined to 106 by 108. It can be seen that this response is of the same form as that previously described (100/104/102), but with a trough at $f_1/2$ and 6 dB higher. Thus, if the response 100/104/102 is arranged so that its minimum impedance and the frequency $f_1$ match the values required for the equaliser at a tape speed $v_1$, changing to a tape speed of $v_1/2$ will automatically shift the equaliser to the response 100/108/106 which will then match the response required at a speed of $v_1/2$ (see FIG. 2(b)).

As indicated earlier, the desired two-fold change in the values $R_s$ and $C_s$ can be achieved with sufficient accuracy using close-tolerance fixed-value components. The resonant response is adjusted relative to the capacitive response (to set the frequency $f_1$ and the corresponding relative minimum impedance) by varying the value $R_G$ of the rheostat 64, which moves the responses 102 and 106 (and the related responses for other tape speeds) up and down relative to the response 100 of the capacitor 30. The overall absolute impedance values for the entire response are adjusted by means of the potentiometer 82.

The slight variation in equaliser high-frequency response required to cater for variations in frequency response between tracks is provided by the rheostat 52. As shown in formulae (2) and (5), its value $R_p$ affects the value of r and therefore the impedance at the resonant frequency $f_R$. However, the value $R_p$ has very little effect on the response in the very high- or very low-frequency portions thereof. Thus, altering the value $R_p$ of the rheostat 52 shifts the peak impedance of each response up or down slightly, without altering the impedance at very high or very low frequencies; consequently, the slope of the responses such as 102, 106 is altered, providing the desired adjustment for different tracks $t_1$, $t_2$ etc (see FIG. 2(b)).

Since the components 52 and 64 are unaffected by operation of the switch 50, they effectively adjust all the responses 100/104/102, 100/108/106 etc. simultaneously. Thus, only two tuning adjustments in total are required for each track, in contrast to the three or four per speed for each track (typically 24 or 32 per track for an 8-speed recoder) previously required.

The resistor ladder 68 and the switching-transistor array 70 enable phase compensation to be provided in accordance with tape speed by combining a component (the amplitude of which is chosen by means of the resistor ladder 68) derived from the original input signal with the equalised signal. By virtue of the operation of the capacitor 30 and the gyrator 42, the equalised signal is in phase quadrature with the original input signal, so the effect of this combination is to phase-shift the equalised signal by an amount depending on the amplitude selected for the component derived from the input signal. Furthermore, the changeover switch 74 is arranged to be moved from the position shown to its other position in the event that the tape is to be replayed backwards, in order that the component of the original input signal received by the output transistor 36 from the resistor ladder 68 should be inverted by the differential amplifier 80, so as to cause the phase-shifting of the equalised signal in the opposite sense. Thus the required phase compensation with tape speed is provided by combining the equalised signal with a controlled-amplitude version of the original unequalised signal. In addition, phase compensation for reverse playback is achieved merely by inverting (180° phase-shift) this component obtained from the unequalised signal.

Various modifications can be made to the circuit shown in FIG. 1 to suit different circumstances. Thus, the phase compensation for direction of playback could alternatively be provided by selectively switching a first resistor in series with the capacitor 30 for forward playback, and a second resistor in series with the input to the gyrator 42 for reverse playback.

If only a limited range of tape speeds is involved, a single resistor 46 could be provided for the resistance $R_s$, and only the capacitors 54 need be switched. In this case, the values of successive capacitors would have to quadruple for each successive halving of tape speed, and a separate rheostat 52 would have to be provided in association with each capacitor 54.

The relative phase inversion effected by the differential amplifier 24 could alternatively be implemented in the output transistor 36, for example by coupling the output of the gyrator 42 to the emitter of the output transistor 36 rather than to the base. As another possibility, the capacitor 30 and the capacitor 38-gyrator 42 combination can be arranged to receive the same input signal and be coupled as an equivalent series-tuned circuit, and the combined filtered signals supplied either to an all-pass filter for phase compensation, or to a phase compensation network switch-adjusted in accordance with tape speed and followed by a circuit for selectively adding the unfiltered signal either with or without inversion as described above.

I claim:
1. A switch-tuned filter for use in an equaliser in a magnetic tape recorder, comprising:
   input means arranged to receive an input signal;
   a capacitive filter responsively coupled to said input means to provide a first filtered signal;
   a resonant filter responsively coupled to said input means to provide a second filtered signal, said resonant filter including a gyrator and having a frequency response dependent at least in part on circuit values in two circuit paths in said gyrator;
   switch means arranged to select different circuit values in at least one of said paths;
   amplitude control means responsively coupled to said input means to provide a controlled-amplitude signal;
   means, coupled to said amplitude control means, for selectively inverting said controlled-amplitude signal; and
   means responsively coupled to said capacitive filter, said resonant filter, and said inverting means to combine said first and second filtered signals with said said controlled amplitude signal.
2. A filter according to claim 1, characterised in that said capacitive filter has a purely capacitive frequency response.
3. A filter according to claim 1, characterised in that said switch means is arranged to select different circuit values in each of said paths.
4. A filter according to claim 3, characterised in that said switch means is arranged to select different resistive values in one of said circuit paths and different capacitive values in the other path.
5. A filter according to claim 4, characterised in that said switch means is arranged to select values which successively double.
6. A filter according to claim 4 or claim 5, characterised in that said other path includes variable resistive means in series with said selectable capacitive values.
7. A filter according to claim 1, characterised in that said resonant filter is coupled to said combining means via variable-gain amplifier means.
8. A filter according to claim 1, characterised in that said resonant filter comprises fixed-value capacitance means in parallel with said gyrator.
9. A filter according to claim 1, characterised in that said combining means is arranged to sum said first and second filtered signals.
10. A filter according to claim 1, characterised in that said input means is arranged to provide anti-phase signals to said capacitive filter and said resonant filter respectively.
11. A filter according to claim 1, characterised in that said amplitude-control means comprises a potential divider.

* * * * *